United States Patent
Nakamura et al.

(10) Patent No.: US 12,261,014 B2
(45) Date of Patent: Mar. 25, 2025

(54) SCANNING ELECTRON MICROSCOPE AND OBJECTIVE LENS

(71) Applicant: JEOL Ltd., Tokyo (JP)

(72) Inventors: Motohiro Nakamura, Tokyo (JP); Takeyuki Kobayashi, Tokyo (JP)

(73) Assignee: JEOL Ltd., Tokyo (JP)

( * ) Notice: Subject to any disclaimer, the term of this patent is extended or adjusted under 35 U.S.C. 154(b) by 427 days.

(21) Appl. No.: 17/859,399

(22) Filed: Jul. 7, 2022

(65) Prior Publication Data

US 2023/0014270 A1     Jan. 19, 2023

(30) Foreign Application Priority Data

Jul. 8, 2021 (JP) .................................. 2021-113476

(51) Int. Cl.
*H01J 37/14* (2006.01)
*H01J 37/28* (2006.01)

(52) U.S. Cl.
CPC .............. *H01J 37/14* (2013.01); *H01J 37/28* (2013.01)

(58) Field of Classification Search
CPC .................................. H01J 37/14; H01J 37/28
See application file for complete search history.

(56) References Cited

U.S. PATENT DOCUMENTS

| | | | | |
|---|---|---|---|---|
| 6,233,813 B1 * | 5/2001 | Sasaki | ................... | G11B 5/3116 29/603.18 |
| 6,330,743 B1 * | 12/2001 | Iijima | ................... | G11B 5/3116 29/603.18 |
| 2017/0316915 A1 | 11/2017 | Okai et al. | | |
| 2018/0261422 A1 | 9/2018 | Kuramoto et al. | | |
| 2019/0036396 A1 * | 1/2019 | Ishii | ........................ | H02K 3/524 |
| 2021/0375583 A1 * | 12/2021 | Mizutani | ............... | H01J 37/244 |

FOREIGN PATENT DOCUMENTS

| | | |
|---|---|---|
| EP | 2019414 A1 | 1/2009 |
| JP | H11111211 A | 4/1999 |
| JP | 200275264 A | 3/2002 |
| JP | 2005285485 A | 10/2005 |
| JP | 2008146890 A | 6/2008 |
| JP | 2017199606 A | 11/2017 |
| JP | 2018147764 A | 9/2018 |

OTHER PUBLICATIONS

Office Action issued in JP2021113476 on Apr. 18, 2023.
Extended European Search Report issued in EP22180336.4 on Dec. 1, 2022.

* cited by examiner

*Primary Examiner* — Nicole M Ippolito
(74) *Attorney, Agent, or Firm* — The Webb Law Firm (57) ABSTRACT

There is provided a scanning electron microscope which has a sample chamber capable of being evacuated to a low vacuum. The scanning electron microscope includes an electron gun for emitting an electron beam, an objective lens for focusing the emitted beam onto a sample, and a sample chamber in which the sample is housed. The objective lens includes an inner polepiece, an outer polepiece disposed outside the inner polepiece and facing the sample chamber, at least one through-hole extending through the inner and outer polepieces, and at least one cover member that closes off the through-hole. An opening is formed between the inner polepiece and the outer polepiece. The objective lens causes leakage of magnetic field from the opening toward the sample. The sample chamber has a degree of vacuum lower than that in an inner space that forms an electron beam path inside the inner polepiece.

9 Claims, 5 Drawing Sheets

SCANNING ELECTRON MICROSCOPE AND OBJECTIVE LENS

CROSS-REFERENCE TO RELATED APPLICATION

This application claims priority to Japanese Patent Application No. 2021-113476 filed Jul. 8, 2021, the disclosure of which is hereby incorporated by reference in its entirety.

BACKGROUND OF THE INVENTION

1. Field of the Invention

The present invention relates to a scanning electron microscope and an objective lens.

2. Description of the Related Art

A scanning electron microscope is an instrument for imaging a sample by scanning it with an electron beam and detecting secondary electrons or backscattered electrons emanating from the sample. A scanning electron microscope generally has its interior maintained in a high vacuum. Low-vacuum scanning electron microscopes have attracted attention in which a sample can be observed in a sample chamber which is placed in a low vacuum environment while keeping the electron gun and electron optical system in a high vacuum environment as set forth, for example, in JP-A-2005-285485. In such a low-vacuum scanning electron microscope, various samples including insulators, aqueous samples, and samples giving off large amounts of gas can be observed.

Objective lenses for use in scanning electron microscopes come in various types. For example, JP-A-2018-147764 discloses a semi-in-lens objective lens having inner and outer polepieces. A sample is placed in a magnetic field which leaks from between the inner and outer polepieces. In the semi-in-lens objective lens, electrons released from the sample are absorbed up into the objective lens and guided upwards along the optical axis by the magnetic field leaking from the objective lens. Therefore, in the objective lens of this type, electrons released from the sample are detected by a detector inserted in a through-hole extending through the objective lens.

However, in the scanning electron microscope equipped with a semi-in-lens objective lens, the objective lens is provided with the through-hole as described above. Therefore, the interior space of the objective lens is in communication with the sample chamber via the through-hole. Accordingly, when the sample chamber is evacuated to a low vacuum, even the electron gun chamber and the electron beam path inside of the objective lens which need a high vacuum are placed in a low vacuum environment.

SUMMARY OF THE INVENTION

One aspect of a scanning electron microscope associated with the present invention comprises: an electron gun for emitting an electron beam; an objective lens for focusing the emitted electron beam onto a sample; and a sample chamber in which the sample is housed. The objective lens includes: an inner polepiece; an outer polepiece disposed outside the inner polepiece and facing the sample chamber; at least one through-hole extending through the inner and outer polepieces; and at least one cover member that closes off the through-hole. The objective lens causes leakage of magnetic field from an opening between the inner and outer polepieces toward the sample. The sample chamber has a degree of vacuum lower than that in an inner space that forms an electron beam path inside the inner polepiece.

In this scanning electron microscope, the through-hole going through the inner and outer magnetic polepieces is plugged up by the cover member and, therefore, if the degree of vacuum in the sample chamber is made lower than that in the space inside the inner polepiece, this inner space can be maintained in a high vacuum. Consequently, the sample can be observed while placing the sample chamber in a low vacuum.

One aspect of an objective lens associated with the present invention is for use in a scanning electron microscope and comprises an inner polepiece, an outer polepiece disposed outside the inner polepiece, at least one through-hole extending through the inner and outer polepieces, and at least one cover member that closes off the through-hole. There is leakage of magnetic field toward a sample from an opening between the inner and outer polepieces.

In this objective lens, the through-hole extending through the inner and outer polepieces is closed off by the cover member and, therefore, if the degree of vacuum in the sample chamber is made lower than that in the space inside of the inner polepiece, this inner space can be maintained in a high vacuum. Consequently, the sample can be observed while placing the sample chamber in a low vacuum.

DESCRIPTION OF THE INVENTION

The preferred embodiments of the present invention are hereinafter described in detail with reference to the accompanying drawings. It is to be noted that the preferred embodiments described below are not intended to unduly restrict the scope and spirit of the present invention delineated by the appended claims and that not all the configurations described below are the essential constituent components of the present invention.

1. Scanning Electron Microscope

Figure 1:
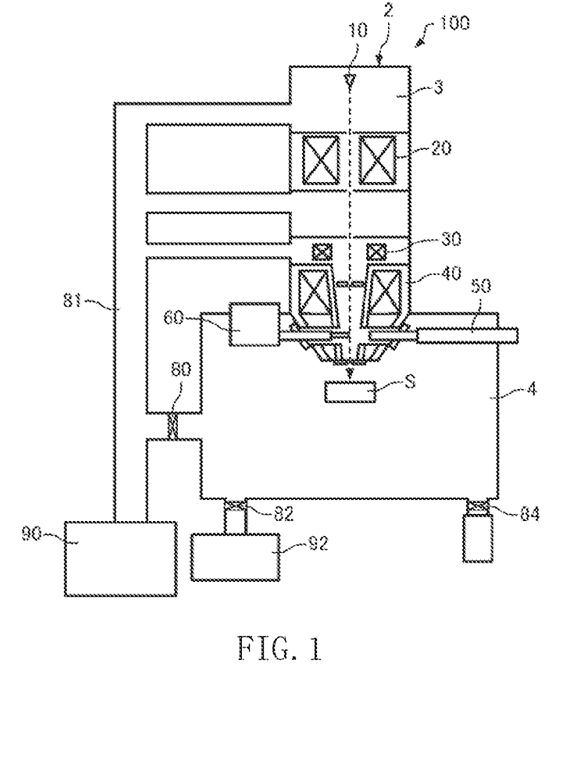
FIG. 1 is a block diagram of a scanning electron microscope associated with one embodiment of the present invention.

A scanning electron microscope associated with one embodiment of the present invention is first described by referring to FIG. 1, which shows the configuration of this scanning electron microscope, 100. The microscope 100 is an apparatus for imaging a sample S by scanning it with an electron beam (electron probe) and detecting secondary electrons or backscattered electrons emanating from the sample S. As shown, the electron microscope 100 includes an electron optical column 2, a sample chamber 4, an electron gun 10, condenser lenses 20, scan coils 30, an objective lens 40, a detector 50, a tertiary electron generator 60, valves 80, 82, 84, a vacuum pumping system 90, and vacuum pumping equipment 92.

The electron gun 10 emits the electron beam, for example, by accelerating electrons, which are released from a cathode, by means of an anode. The electron gun 10 is housed in an electron gun chamber 3 that is present within the electron optical column 2.

The condenser lenses 20 condense the electron beam released from the electron gun 10 and can control the diameter and current of the electron probe. The objective lens 40 focuses the electron beam into the electron probe. The objective lens 40 will be described in detail later.

The electron probe formed by the condenser lenses 20 and the objective lens 40 is deflected in two dimensions by the scan coils 30. Thus, the sample S can be scanned with the electron probe.

The condenser lenses 20, scan coils 30, and objective lens 40 together constitute an electron optical system operating to form the electron probe with which the sample S is scanned. The electron optical system may include lenses, apertures, and other optical elements, as well as the condenser lenses 20, scan coils 30, and objective lens 40.

The detector 50 detects electrons produced from the sample S in response to irradiation with the electron beam. For example, the detector 50 is a secondary electron detector for detecting secondary electrons produced from the sample S. The detector 50 includes, for example, a corona ring to which a high voltage is applied, a scintillator on which electrons impinge, and a photomultiplier tube for converting light emerging from the scintillator into an electron signal.

The tertiary electron generator 60 includes a metal plate against which the electrons released from the sample S collide. In the scanning electron microscope 100, high-energy electrons (secondary electrons) released from the sample S by irradiation with an electron beam (primary electrons) are caused to collide against the metal plate, producing tertiary electrons which can be detected by the detector 50.

The sample S is received in the sample chamber 4 with which the valves 80, 82, and 84 are connected. The valve 80 is connected with the vacuum pumping system 90 via an exhaust tube 81. The sample chamber 4 is evacuated to a vacuum by opening the valve 80. A space including the electron gun chamber 3 and a space forming an electron beam path in the electron optical column 2 as well as the sample chamber 4 can be evacuated to a high vacuum by the vacuum pumping system 90. The valve 82 is connected with the vacuum pumping equipment 92 which consists, for example, of a rotary pump. The valve 84 is a leak valve for introducing gas into the sample chamber 4. The degree of vacuum (pressure) in the sample chamber 4 can be regulated to a desired level by adjusting the degree of opening of the leak valve 84.

In the scanning electron microscope 100, the internal pressure of the sample chamber 4 is set to a low vacuum of from on the order of Pa to hundreds of Pa, and the sample S can be observed. When the sample chamber 4 is evacuated to a low vacuum, the valve 80 is closed and the valves 82 and 84 are controlled.

2. Objective Lens

Figure 2:
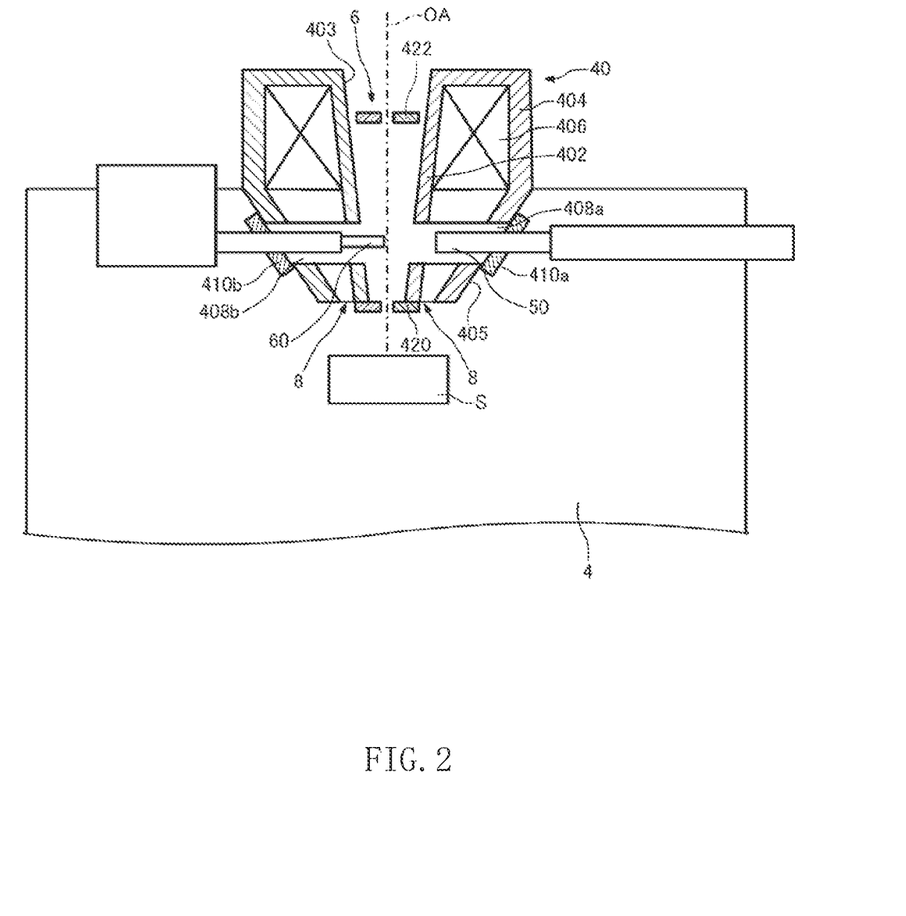
FIG. 2 is a schematic vertical cross section of an objective lens.
Figure 3:
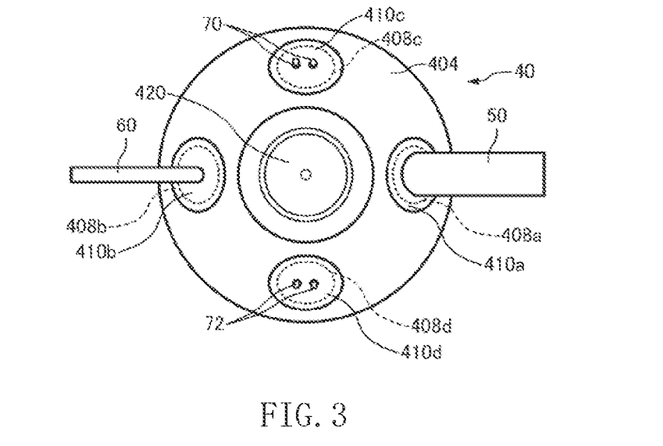
FIG. 3 is a schematic top plan view of the objective lens.

FIG. 2 is a schematic cross-sectional view of the objective lens 40. FIG. 3 is a schematic view of the objective lens 40 as viewed from the sample chamber side. As shown in FIGS. 2 and 3, the objective lens 40 includes an inner polepiece 402, an outer polepiece 404, a coil 406, a first cover member 410*a*, a second cover member 410*b*, a third cover member 410*c*, and a fourth cover member 410*d*. The objective lens 40 is of the semi-in-lens type and causes leakage of magnetic field toward the sample S from an opening 8 between the inner polepiece 402 and the outer polepiece 404.

The inner polepiece 402 is disposed inside the outer polepiece 404. A space 6 inside of the inner polepiece 402 forms an electron beam path. The objective lens 40 has an optical axis OA passing through the inner space 6. The electron beam passes through the inner space 6 along the optical axis OA and impinges on the sample S. The outer polepiece 404 is disposed outside the inner polepiece 402 and has an outside surface 405 that faces the sample chamber 4.

The inner magnetic polepiece 402 and the outer magnetic polepiece 404 together create a magnetic path. The inner and outer polepieces 402, 404 cooperate to confine lines of magnetic force created by the coil 406 and to cause leakage of magnetic field toward the sample S from the opening or aperture 8 between the inner polepiece 402 and the outer polepiece 404. Therefore, in the scanning electron microscope 100, the sample S is placed in the magnetic field leaking from the objective lens 40.

The coil 406 is disposed in a space surrounded by the inner polepiece 402 and outer polepiece 404 and produces a magnetic field. The coil 406 is wound along a circle centered at the optical axis OA. When the coil 406 is electrically energized, magnetic fluxes are created around the inner polepiece 402 and outer polepiece 404, causing leakage of magnetic field from the opening 8.

An acceleration electrode 420 is mounted at the front end of the objective lens 40. The acceleration electrode 420 is attached to the front end of the inner polepiece 402 via an insulation layer (not shown) and provided with a through-hole for passage of the electron beam.

The acceleration electrode 420 produces an electric field such that electrons emitted from the sample S are thereby urged into the inner space 6. In the scanning electron microscope 100, the electrons emitted from the sample S are constrained in the magnetic field leaking from the objective lens 40 and guided into the inner space 6 through the through-hole of the acceleration electrode 420, i.e., guided by the acceleration electrode 420.

The acceleration electrode 420 is disposed between the inner space 6 and the sample chamber 4 and functions also as an orifice for maintaining a differential pressure between the inner space 6 and the sample chamber 4. Therefore, the sample chamber 4 can be evacuated to a low vacuum while maintaining the inner space 6 in a high vacuum.

A deceleration electrode 422 is disposed in the inner space 6 and placed above the detector 50, i.e., closer to the electron gun 10. The deceleration electrode 422 prevents the electrons guided into the inner space 6 by the acceleration electrode 420 from traveling upwardly. In the scanning electron microscope 100, the electrons released from the sample S are guided to the detector 50 by the acceleration electrode 420 and deceleration electrode 422. There may be other electrodes (not shown) in the inner space 6 such that the electrons emitted from the sample S are guided to the detector 50.

Figure 4:
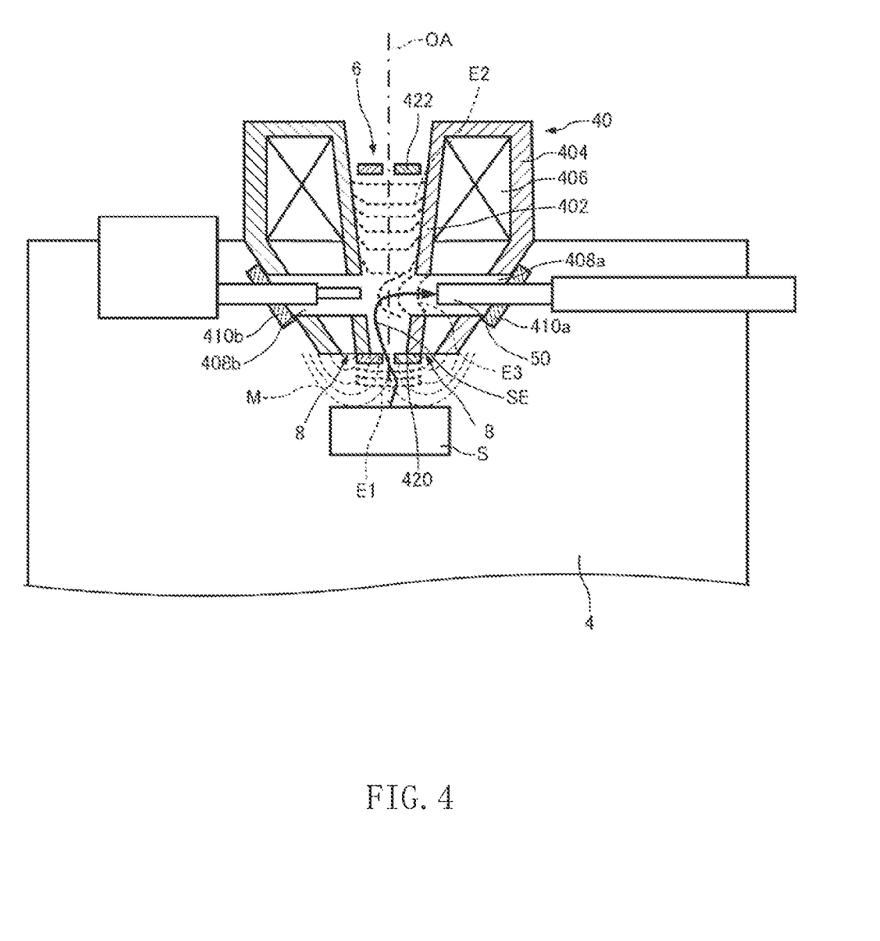
FIG. 4 is a schematic vertical cross section similar to FIG. 2, but illustrating the manner in which secondary electrons are detected by a detector.

The objective lens 40 is provided with a plurality of through-holes extending through both inner polepiece 402 and outer polepiece 404 as shown in FIG. 4. In the illustrated example, the through-holes are a first through-hole 408*a*, a second through-hole 408*b*, a third through-hole 408*c*, and a fourth through-hole 408*d*.

The first through-hole 408*a* interconnects an inner surface 403 of the inner polepiece 402 and the outer surface 405 of the outer polepiece 404. That is, one opening of the first through-hole 408*a* is formed in the inner surface 403 of the inner polepiece 402. The other opening of the through-hole 408a is formed in the outer surface 405 of the outer polepiece 404. The inner surface 403 of the inner polepiece 402 defines the inner space 6 through which the electron beam passes. The outer surface 405 of the outer polepiece 404 faces the sample chamber 4.

Similarly, the second through-hole 408b, third through-hole 408c, and fourth through-hole 408d interconnect the inner surface 403 of the inner polepiece 402 and the outer surface 405 of the outer polepiece 404. The four through-holes 408a, 408b, 408c, and 408d are arranged symmetrically with respect to the optical axis OA and angularly spaced 90 degrees from each other about the optical axis OA.

The first through-hole 408a has a central axis which is orthogonal, for example, to the optical axis OA. Similarly, the second, third, and fourth through-holes 408b, 408c, 408d have their respective central axes orthogonal to the optical axis OA. Note that it is not essential that the central axis of the first through-hole 408a be orthogonal to the optical axis OA.

The detector 50 is inserted in the first through-hole 408a. The tertiary electron generator 60 is inserted in the second through-hole 408b. Voltage supply terminals 70 are inserted in the third through-hole 408c. Other voltage supply terminals 72 are inserted in the fourth through-hole 408d. The supply terminals 70 and 72 are used to supply voltages to the acceleration electrode 420, deceleration electrode 422, and other electrodes placed in the inner space 6.

The first through-hole 408a is plugged up by the first cover member 410a, which in turn closes off the opening of the first through-hole 408a that is formed in the outer surface 405 of the outer polepiece 404. The first cover member 410a is provided with an insertion hole extending therethrough. The detector 50 is inserted in the insertion hole. The first cover member 410a plugs up the gap between the detector 50 and the outer polepiece 404.

The second through-hole 408b is plugged up by the second cover member 410b, which in turn closes off the opening of the second through-hole 408b that is formed in the outer surface 405 of the outer polepiece 404. The second cover member 410b is provided with an insertion hole extending therethrough. The tertiary electron generator 60 is inserted in the insertion hole. The second cover member 410b plugs up the gap between the tertiary electron generator 60 and the outer polepiece 404.

The third through-hole 408c is plugged up by the third cover member 410c, which in turn closes off the opening of the third through-hole 408c that is formed in the outer surface 405 of the outer polepiece 404. The third cover member 410c has terminals 70 capable of supplying voltages to the electrodes in the inner space 6 from outside while maintaining the airtightness of the inner space 6. Cables (not shown) which interconnect the terminals 70 and electrodes are connected to the electrodes through the third through-hole 408c.

The fourth through-hole 408d is plugged up by the fourth cover member 410d, which in turn closes off the opening of the fourth through-hole 408d that is formed in the outer surface 405 of the outer polepiece 404. The fourth cover member 410d has terminals 72 capable of supplying voltages to the electrodes in the inner space 6 from outside while maintaining the airtightness of the inner space 6. Other cables (not shown) which interconnect the terminals 72 and electrodes are connected to the electrodes through the fourth through-hole 408d.

The first cover member 410a is made of a nonmagnetic material (such as resin, e.g., Duracon™). The second cover member 410b, third cover member 410c, and fourth cover member 410d are made of the same material as that of the first cover member 410a.

In the foregoing description, there are four through-holes in the objective lens 40. No restriction is placed on the number of the through-holes formed in the objective lens 40.

3. Operation of Scanning Electron Microscope

In the scanning electron microscope 100, SEM images of the sample S can be obtained while evacuating the sample chamber 4 to a low vacuum. In the following description, secondary electrons emitted from the sample S are detected by the detector 50.

In the scanning electron microscope 100, a space forming an electron beam path inside the electron optical column 2 which includes the electron gun chamber 3 and the space 6 inside of the objective lens 40 is evacuated to a vacuum by the vacuum pumping system 90 via the exhaust tube 81. Therefore, the space inside the electron optical column 2 is maintained in a high vacuum. The pressure in the space within the electron optical column 2 is approximately $1\times10^{-1}$ Pa, for example.

Under this condition, by closing the valve 80 connected to the exhaust tube 81 and controlling the valves 82 and 84, the degree of vacuum or pressure in the sample chamber 4 is adjusted or evacuated to a low vacuum. For example, the valve 82 is opened, and the degree of opening of the valve 84 is adjusted while evacuating the sample chamber 4 to a vacuum by means of the vacuum pumping equipment 92. Air or inert gas is admitted into the sample chamber 4, and the degree of vacuum in the sample chamber 4 is controlled. Consequently, the degree of vacuum in the sample chamber 4 is made lower than that in the inner space of the electron optical column 2. The pressure in the sample chamber 4 is from on the order of Pa to hundreds of Pa, for example.

The acceleration electrode 420 serving as an orifice is disposed between the inner space 6 and the sample chamber 4. This makes it possible to maintain the differential pressure between the inner space 6 and the sample chamber 4 while passing the electron beam. Consequently, the sample chamber 4 can be maintained in a low vacuum.

An electron beam is emitted from the electron gun 10 while placing the interior space of the electron optical column 2 in a high vacuum and at the same time placing the sample chamber 4 in a low vacuum. An electron probe is formed by the condenser lenses 20 and objective lens 40. The sample S is scanned with the electron probe by deflecting the electron beam using the scan coils 30. The electron beam emanating from the electron gun 10 received in the electron gun chamber 3 passes through both the inner space 6 of the objective lens 40 and the aperture in the acceleration electrode 420 and impinges on the sample S.

FIG. 4 schematically illustrates the manner in which secondary electrons SE emitted from the sample S are detected by the detector 50. The irradiation of the sample S with the electron beam emits the secondary electrons SE from the sample S. The secondary electrons SE are collected on the optical axis OA by a magnetic field M created by the objective lens 40. The acceleration electrode 420 produces an electric field E1 which causes the collected electrons SE on the optical axis OA to pass into the inner space 6 of the objective lens 40 through the orifice in the acceleration electrode 420. In the inner space 6, the secondary electrons SE are hindered from traveling upwards by the electric field E2 set up by the deceleration electrode 422.

The detector 50 has a corona ring which produces an electric field E3. In the objective lens 40, the secondary electrons SE are attracted to the electric field E3 and collide against the scintillator, producing light which is converted into an electrical signal by a photomultiplier tube. In this way, the secondary electrons SE produced from the sample S can be detected. An SEM image can be derived by scanning the sample S with the electron probe and detecting the intensity of secondary electrons at each beam impact point.

4. Advantageous Effects

In the scanning electron microscope 100, the objective lens 40 includes the inner polepiece 402, the outer polepiece 404 disposed outside the inner polepiece 402 and facing the sample chamber 4, the first through-hole 408a extending through both inner polepiece 402 and outer polepiece 404, and the first cover member 410a plugging up the first through-hole 408a. The objective lens 40 causes leakage of the magnetic field M from the opening 8 between the inner polepiece 402 and the outer polepiece 404 toward the sample S. The degree of vacuum in the sample chamber 4 is lower than that in the inner space 6 inside of the inner polepiece 402 which forms an electron beam path.

In this way, in the scanning electron microscope 100, the first through-pole 408a running through both the inner polepiece 402 and outer polepiece 404 is plugged up by the first cover member 410a and, therefore, if the degree of vacuum in the sample chamber 4 is made lower than that in the inner space 6, the inner space 6 can be maintained in a high vacuum. Consequently, the sample S can be observed under conditions where the sample chamber 4 is placed in a low vacuum and where the inner space 6 and the interior space of the electron optical column 2 including the electron gun chamber 3 are placed in a high vacuum.

The scanning electron microscope 100 includes the orifice formed by the acceleration electrode 420 mounted between the inner space 6 and the sample chamber 4. Therefore, in the microscope 100, the differential pressure between the inner space 6 and the sample chamber 4 can be maintained while passing the electron beam.

The scanning electron microscope 100 includes the detector 50 disposed in the first through-hole 408a. The first cover member 410a is provided with the insertion hole in which the detector 50 is inserted. Therefore, in the scanning electron microscope 100, the detector 50 can be placed in the inner space 6 while maintaining the differential pressure between the inner space 6 and the sample chamber 4.

In the scanning electron microscope 100, the objective lens 40 is provided with the plurality of through-holes which are arranged symmetrically with respect to the optical axis OA. In the example shown in FIG. 3, there are four through-holes which are arranged at angular intervals of 90 degrees about the optical axis OA. Therefore, in the scanning electron microscope 100, the presence of the through-holes can reduce the effect on the electron beam passing through the objective lens 40. As an example, if plural through-holes are arranged asymmetrically, the asymmetry of the objective lens 40 may produce astigmatism. Symmetrical arrangement of a plurality of through-holes can produce reduced astigmatism.

In the scanning electron microscope 100, the first cover member 410a is made of a resinous material and, therefore, has no magnetic effect on the electrons released from the sample S. The objective lens 40 of the scanning electron microscope 100 is of the semi-in-lens type and causes leakage of magnetic field toward the sample S from the opening 8 between the inner polepiece 402 and the outer polepiece 404. The electrons released from the sample S are constrained by the magnetic field M leaking from the opening 8 of the objective lens 40. Therefore, if the first cover member 410a is made of a resin, the electrons released from the sample S do not electrostatically charge the first cover member 410a. Consequently, in the scanning electron microscope 100, a normal SEM image can be obtained while maintaining the differential pressure between the inner space 6 and the sample chamber 4. If the first cover member 410a were electrostatically charged, the orbit of the electron beam would be bent, hindering normal SEM imaging.

The effect produced by making the first cover member 410a from a resin has been described. Where the second, third, and fourth cover members 410b, 410c, 410d are made of a resin, the same effect arises.

In the scanning electron microscope 100, the deceleration electrode 422 is mounted in the inner space 6. The third cover member 410c is provided with the terminals 70 for supplying a voltage to the deceleration electrode 422. Therefore, in the scanning electron microscope 100, a voltage can be supplied to the deceleration electrode 422 while maintaining the differential pressure between the inner space 6 and the sample chamber 4.

5. Modification

Figure 5:
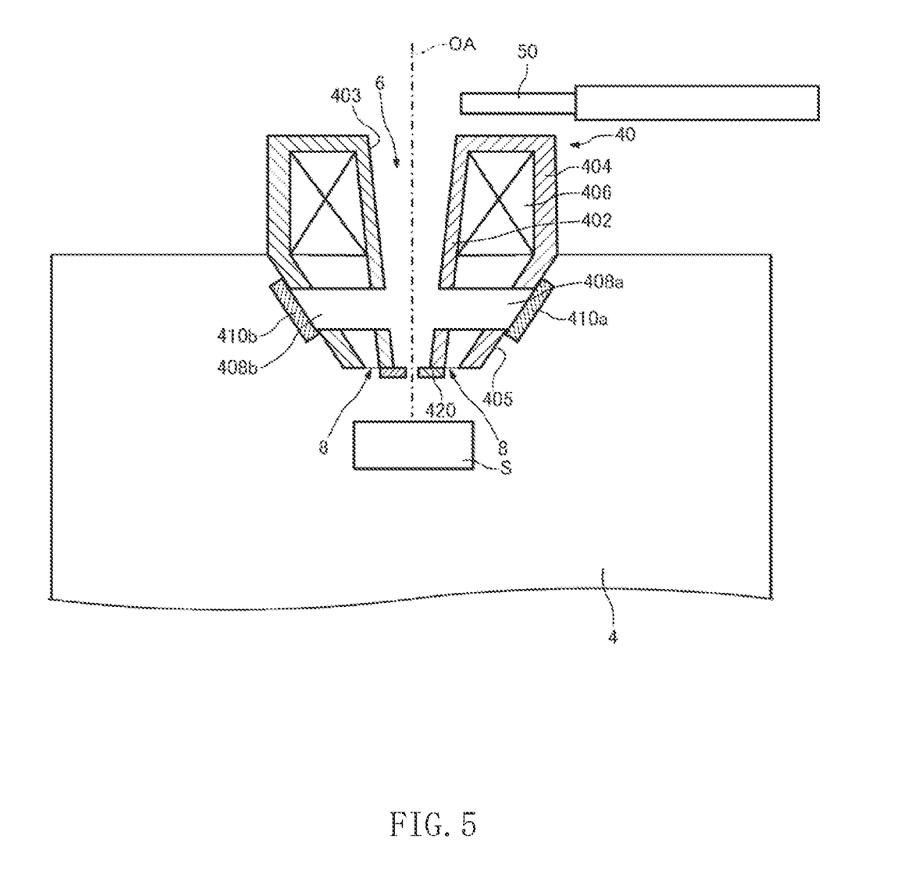
FIG. 5 is a schematic vertical cross section showing a modification of the scanning electron microscope of FIG. 1.

FIG. 5 shows a modification of the configuration of the scanning electron microscope 100. In the scanning electron microscope of FIG. 5, members which are similar in function to their respective counterparts of the above-described scanning electron microscope 100 shown in FIGS. 1-3 are indicated by the same reference numerals as in the above-referenced figures and a detailed description thereof is omitted.

In the above-described scanning electron microscope 100, the detector 50 is inserted in the first through-hole 408a. The detector 50 may also be disposed above the objective lens 40 as shown in FIG. 5, in which case a detector or any other component is not disposed in the first through-hole 408a. The first through-hole 408a is plugged up by the first cover member 410a. Similarly, a detector or the like is not disposed in the second through-hole 408b, which in turn is plugged up by the second cover member 410b.

It is to be understood that the present invention is not restricted to the above embodiments but rather can be practiced in various modified forms. For example, the present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

What is claimed is:

1. A scanning electron microscope comprising:
   an electron gun for emitting an electron beam;
   an objective lens for focusing the emitted electron beam onto a sample; and
   a sample chamber in which the sample is housed;
   wherein the objective lens comprises an inner polepiece comprising an inner surface that defines an inner space through which the electron beam passes, an outer polepiece disposed outside the inner polepiece and facing the sample chamber, at least one through-hole extending through the inner and outer polepieces, and at least one cover member that closes off the through-hole;

wherein the objective lens causes leakage of magnetic field from an opening between the inner and outer polepieces toward the sample;

wherein the sample chamber has a degree of vacuum lower than that in an inner space that forms an electron beam path inside the inner polepiece; and wherein one opening of the at least one through-hole is formed in the inner surface of the inner polepiece and another opening of the at least one through-hole is formed in an outer surface of the outer polepiece, the outer surface facing the sample chamber.

2. The scanning electron microscope as set forth in claim 1, wherein an orifice is formed between said inner space and said sample chamber.

3. The scanning electron microscope as set forth in claim 1, wherein said sample chamber is in a low vacuum.

4. The scanning electron microscope as set forth in claim 1, wherein there is further provided a detector disposed in said through-hole, and wherein said cover member is provided with an insertion hole in which the detector is inserted.

5. The scanning electron microscope as set forth in claim 1, wherein said at least one through-hole is plural in number and arranged symmetrically with respect to an optical axis.

6. The scanning electron microscope as set forth in claim 1, wherein said at least one through-hole is four in number and arranged at angular intervals of 90 degrees about an optical axis.

7. The scanning electron microscope as set forth in claim 1, wherein said cover member is made of a resinous material.

8. The scanning electron microscope as set forth in claim 1, wherein electrodes are mounted in said inner space, and wherein said cover member has voltage supply terminals for supplying voltages to the electrodes.

9. An objective lens for use in a scanning electron microscope, comprising:

an inner polepiece comprising an inner surface that defines an inner space through which an electron beam passes;

an outer polepiece disposed outside the inner polepiece;

at least one through-hole extending through the inner and outer polepieces;

at least one cover member that closes off the through-hole; and an opening which is formed between the inner polepiece and the outer polepiece and through which there is leakage of magnetic field toward a sample, wherein one opening of the at least one through-hole is formed in the inner surface of the inner polepiece and another opening of the at least one through-hole is formed in an outer surface of the outer polepiece.

* * * * *